(12) United States Patent
Yang et al.

(10) Patent No.: US 9,123,722 B2
(45) Date of Patent: Sep. 1, 2015

(54) SEMICONDUCTOR CONSTRUCTIONS AND METHODS OF FORMING INTERCONNECTS

(71) Applicant: Micron Technology, Inc., Boise, ID (US)

(72) Inventors: Ming-Chuan Yang, Meridian, ID (US); Zengtao T. Liu, Boise, ID (US); Vishal Sipani, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/177,030

(22) Filed: Feb. 10, 2014

(65) Prior Publication Data

US 2014/0151902 A1    Jun. 5, 2014

Related U.S. Application Data

(62) Division of application No. 13/211,601, filed on Aug. 17, 2011, now Pat. No. 8,647,977.

(51) Int. Cl.
*H01L 23/522* (2006.01)
*H01L 21/768* (2006.01)

(52) U.S. Cl.
CPC ...... *H01L 23/5226* (2013.01); *H01L 21/76885* (2013.01)

(58) Field of Classification Search
CPC .......... H01L 2924/0002; H01L 2924/00; H01L 21/0337; H01L 21/3086; H01L 21/31144; H01L 21/32139; H01L 21/76807; H01L 21/76817; H01L 21/7682; H01L 2221/1021; H01L 23/4821; H01L 23/522; H01L 23/5222
USPC ........... 257/773, 774, E21.003, E21.577, 257/E21.585, E23.011, E23.168, E27.009, 257/E29.255, 288, 528
See application file for complete search history.

(56) References Cited

U.S. PATENT DOCUMENTS

| | | | |
|---|---|---|---|
| 6,323,123 B1 * | 11/2001 | Liu et al. | 438/638 |
| 6,734,081 B1 * | 5/2004 | Puchner et al. | 438/432 |
| 7,060,543 B2 * | 6/2006 | Choi et al. | 438/151 |
| 7,141,881 B2 * | 11/2006 | Takayama et al. | 257/758 |
| 7,268,432 B2 * | 9/2007 | Colburn et al. | 257/774 |
| 7,312,531 B2 * | 12/2007 | Chang et al. | 257/770 |
| 7,396,759 B1 * | 7/2008 | van Schravendijk et al. | 438/625 |
| 7,473,633 B2 * | 1/2009 | Furukawa et al. | 438/622 |
| 7,588,883 B2 * | 9/2009 | Chen et al. | 430/322 |
| 7,843,073 B2 * | 11/2010 | Iwasaki | 257/774 |
| 8,236,682 B2 * | 8/2012 | Byun et al. | 438/626 |
| 2003/0211724 A1 * | 11/2003 | Haase | 438/629 |
| 2007/0106964 A1 * | 5/2007 | Meindl et al. | 716/2 |

(Continued)

*Primary Examiner* — Stephen W Smoot
*Assistant Examiner* — Edward Chin
(74) *Attorney, Agent, or Firm* — Wells St. John P.S.

(57) ABSTRACT

Some embodiments include methods of forming interconnects. A first circuitry level may be formed, and a first dielectric region may be formed over such first level. A second level of circuitry may be formed over the first dielectric region. An interconnect may be formed to extend through such second level. A second dielectric region may be formed over the second level of circuitry, and a third level of circuitry may be formed over the second dielectric region. The third level of circuitry may be electrically connected to the first level of circuitry through the interconnect. Some embodiments include constructions having interconnects extending from a first level of circuitry, through an opening in a second level of circuitry, and to a third level of circuitry; with an individual interconnect including multiple separate electrically conductive posts.

20 Claims, 8 Drawing Sheets

(56) References Cited

U.S. PATENT DOCUMENTS

2007/0259519 A1* 11/2007 Yang et al. ............... 438/638
2009/0017575 A1* 1/2009 Knudsen et al. ........... 438/70
2010/0062224 A1* 3/2010 Witvrouw et al. .......... 428/172
2010/0105169 A1* 4/2010 Lee et al. .................. 438/107
2010/0264544 A1* 10/2010 Heo et al. .................. 257/768
2010/0301449 A1* 12/2010 Scheuerlein et al. ....... 257/528
2011/0084397 A1* 4/2011 Lung ........................ 257/774
2011/0272754 A1* 11/2011 Tang et al. ................ 257/314
2012/0037962 A1* 2/2012 Breyta et al. .............. 257/288
2012/0267789 A1* 10/2012 Mohammed et al. ...... 257/774

* cited by examiner

SEMICONDUCTOR CONSTRUCTIONS AND METHODS OF FORMING INTERCONNECTS

RELATED PATENT DATA

This patent resulted from a divisional application of U.S. patent application Ser. No. 13/211,601 which was filed on Aug. 17, 2011 and which is incorporated by reference herein.

TECHNICAL FIELD

Semiconductor constructions and methods of forming interconnects.

BACKGROUND

Semiconductor constructions may be fabricated to have multiple levels of circuitry stacked over a semiconductor base. Some of the levels may be densely packed with repeating circuit elements, such as, for example, levels containing arrays of memory devices. The memory arrays may be a substantial portion of the circuitry, such as, for example, if the semiconductor constructions correspond to DRAM or flash chips. Alternatively, the memory arrays may be a relatively minor portion of the circuitry, such as, for example, in applications in which the arrays correspond to cache within processors or other semiconductor constructions which are primarily logic.

It can be desired to electrically couple two different levels of circuitry that are on opposing sides of a densely patterned intermediate level, without coupling to the intermediate level. Thus, it can be desired to form an electrical interconnection which passes through the intermediate level, without shorting to the intermediate level. Present methods of fabrication may attempt to achieve such electrical interconnection by breaking a circuit pattern within the intermediate level to create a path for the electrical interconnection. However, such methods can damage the circuitry remaining within the intermediate level, which can negatively impact device performance characteristics, and in some cases lead to device failure.

Sometimes dummy features are formed along the intermediate level in locations where interconnections will pass through the intermediate level, and then openings are etched through the dummy features to provide paths for the electrical interconnections. However, the introduction of dummy features creates a new set of complications for a fabrication process, consumes valuable semiconductor real estate that could otherwise be utilized for high-density circuitry, and in some cases does not adequately protect the intermediate level from adverse consequences during formation of electrical interconnections through such intermediate level.

It is desired to develop new methods for forming electrical interconnections passing through densely patterned levels of semiconductor constructions.

DETAILED DESCRIPTION OF THE ILLUSTRATED EMBODIMENTS

In some embodiments, the invention includes methods of forming interconnects which extend from one level of circuitry to another, and through a densely-patterned region of an intermediate level. The densely-patterned region may have repeating electrically conductive features formed to a pitch of, for example, less than or equal to about 100 nanometers (nm), less than or equal to about 50 nm, or even less than or equal to about 35 nm. A location of an interconnect may be defined within the densely-patterned region with a hard mask prior to formation of the electrically conductive features, and then the interconnect may be formed during or after formation of the electrically conductive features without adverse consequences to the electrically conductive features. In some embodiments, dummy features of prior art methods discussed in the "Background" section of this disclosure may be eliminated, and thus problems associated with such dummy features may also be eliminated. Some embodiments include novel interconnects comprising multiple electrically conductive posts extending through densely-patterned regions of intermediate levels.

Example embodiments are described with reference to FIGS. 1-21.

Figure 1:
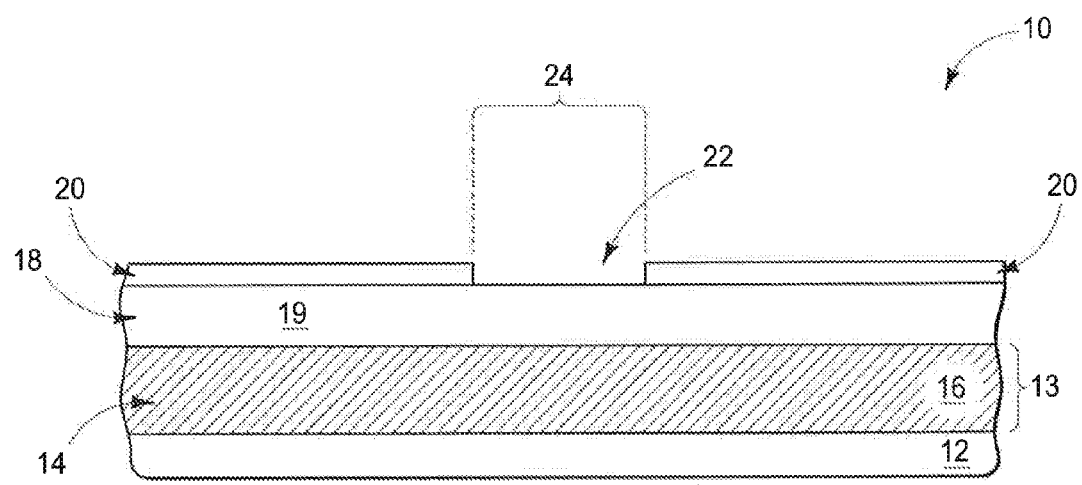
FIGS. 1-9 are diagrammatic cross-sectional views of a portion of a semiconductor construction at various stages of an example embodiment method.

Referring to FIG. 1, a semiconductor construction 10 is shown to comprise a first circuitry level 13 over a semiconductor base 12. The first circuitry level may comprise multiple circuit components that extend in and out of the page relative to the cross-sectional view of FIG. 1. An example circuit component 14 is shown to be a line extending along the plane of the cross-section of FIG. 1. Such line comprises electrically conductive material 16. The electrically conductive material may comprise any suitable composition or combination of compositions; and may, for example, comprise, consist essentially of, or consist of one or more of various metals (for instance, copper, aluminum, nickel, titanium, tungsten, etc.), metal-containing compounds (for instance, metal silicide, metal nitride, metal carbide, etc.) and conductively-doped semiconductor materials (for instance, conductively-doped silicon, conductively-doped germanium, etc.).

In subsequent processing described below, an electrical interconnect will be formed to connect with the illustrated component 14. Although the shown component is a line, in other embodiments (not shown) other components may be utilized.

The circuitry of level 13 may be formed with any suitable processing. For instance, in some embodiments circuitry level 13 may comprise lines associated with NAND architecture, and such lines may be formed with conventional processing.

The semiconductor base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc. Thus, there may be one or more other levels of circuitry beneath the level 13 in some embodiments.

A dielectric region 18 is formed over the circuitry level 13. Dielectric region 18 comprises dielectric material 19, and such may comprise any suitable composition or combination of compositions. In some embodiments, dielectric material 19 may comprise, consist of, or consist of silicon dioxide. The dielectric material may be formed with any suitable processing, including, for example, one or both of atomic layer deposition (ALD) and chemical vapor deposition (CVD).

A patterned hard mask 20 is formed over dielectric region 18. The patterned hard mask may comprise any suitable composition or combination of compositions; and in some embodiments may comprise, consist essentially of, or consist of silicon nitride. The patterned hard mask may be formed with any suitable processing, including, for example, one or both of ALD and CVD. The material of the hard mask may be initially formed to extend entirely across dielectric region 18, and may be then patterned utilizing a photolithographically-patterned photoresist mask (not shown) and suitable processing to transfer a pattern from the photoresist mask into the material of the hard mask. Subsequently, the photoresist mask may be removed to leave the construction of FIG. 1. The hard mask 20 may be optional in some embodiments.

The hard mask 20 is shown to be much thinner than the dielectric region 18. The hard mask 20 and dielectric region 18 may be formed to any suitable thicknesses, depending on the compositions utilized for the hard mask and dielectric region.

The patterned hard mask has an opening 22 extending therethrough. Such opening defines a location 24 within which an interconnect (shown in FIG. 9) will be formed to extend through the dielectric region 18 to electrically connect with the circuit component 14.

Figure 2:
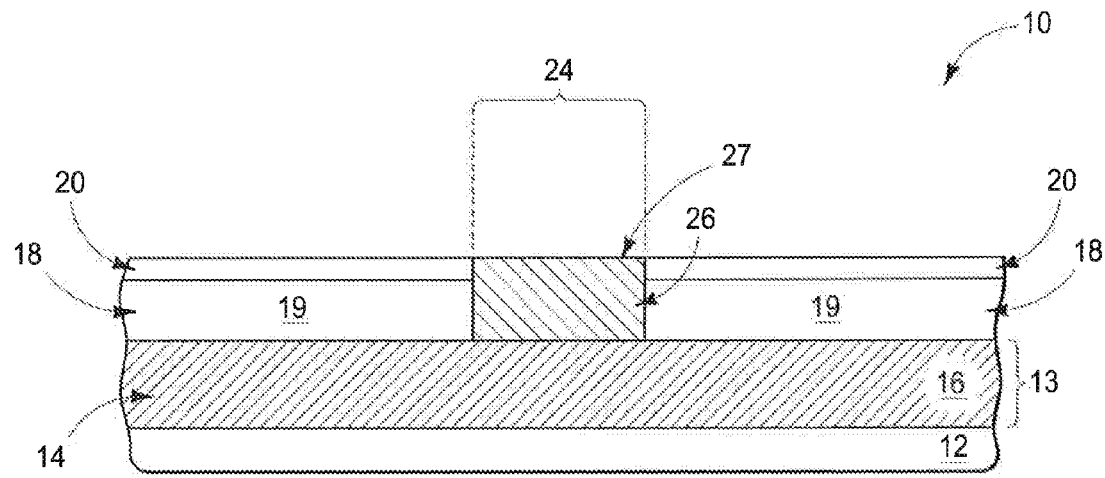

Referring to FIG. 2, opening 22 (FIG. 1) is extended into dielectric region 18, and subsequently an electrically conductive plug 26 is formed within the opening. The electrically conductive plug extends entirely through dielectric region 18 to directly contact an upper surface of electrical component 14. The electrically conductive plug may comprise any suitable electrically conductive material, such as for example, one or more of various metals, metal-containing compounds and conductively-doped semiconductor materials.

The opening 22 (FIG. 1) may be extended into dielectric region 18 with any suitable etch. For instance, if dielectric material 19 comprises silicon dioxide, the opening may be extended into the dielectric material with a fluorine-containing etch.

The conductive plug 26 may be formed within the opening with any suitable processing. For instance, electrically conductive material may be formed within opening 22 and across an upper surface of hard mask 20, and then the construction 10 may be subjected to planarization (for instance, chemical-mechanical polishing (CMP)) to form the shown construction in which plug 26 has an upper surface 27 coextensive with an upper surface of hard mask 20.

Figure 3:
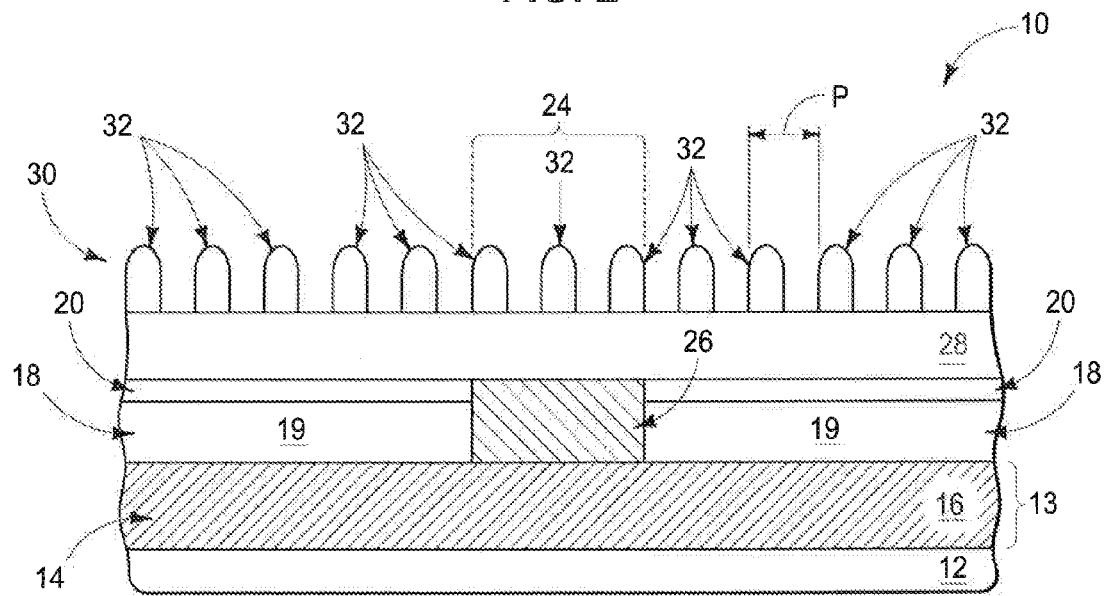

Referring to FIG. 3, mask material 28 is formed over patterned hard mask 20 and conductive plug 26. The mask material may comprise any suitable composition or combination of compositions, and in some embodiments may comprise, consist essentially of, or consist of silicon oxide. The mask material 28 may be selectively etched relative to hard mask 20 in subsequent processing (described below with reference to FIG. 4), and thus it may be desired that the mask material comprise a composition selectively etchable relative to the material of the patterned hard mask 20. In some embodiments, an entirety of mask material 28 is ultimately removed, and in such embodiments the mask material 28 may be referred to as a sacrificial material.

A patterned mask 30 is formed over mask material 28. The patterned mask 30 may be referred to as a second patterned mask to distinguish it from the patterned mask 20.

Patterned mask 30 comprises a plurality of spaced-apart features 32, which may be referred to as template structures. The mask 30 may be formed with any suitable processing, including, for example, photolithographic processing either alone, or in combination with pitch multiplication methodologies. In some embodiments, the features 32 may be densely-patterned, and may be formed to a pitch, P, of less than or equal to about 100 nm, less than or equal to about 50 nm, or even less than or equal to about 35 nm.

Figure 4:
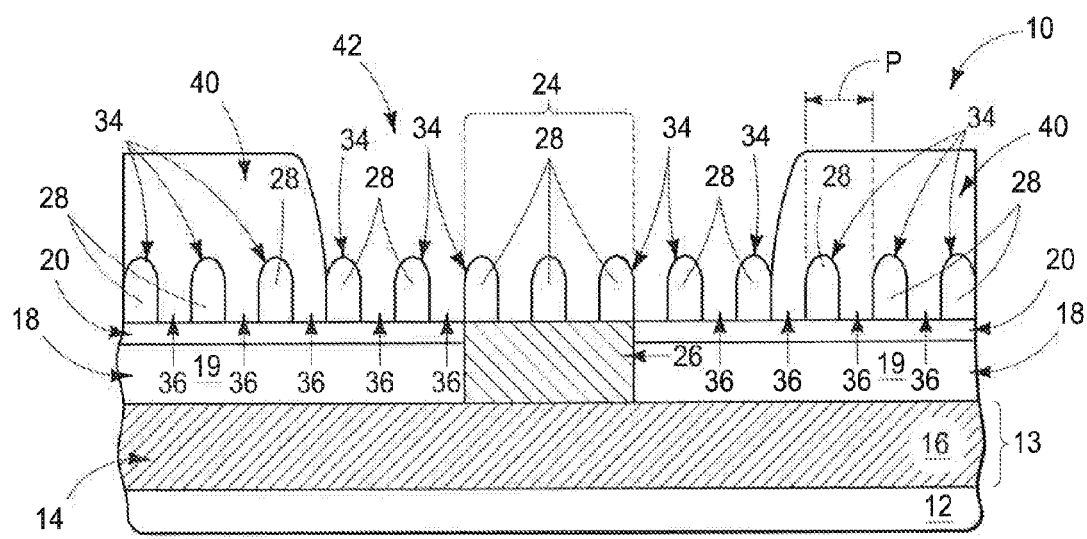

Referring to FIG. 4, a pattern of the template structures 32 (FIG. 3) is transferred into mask material 28 to form the mask material into a plurality of masking features 34 having the pitch P, and subsequently the template structures are removed. Some of the masking features 34 are directly over and in contact with patterned hard mask 20, and others of the masking features are directly over and in contact with conductive plug 26. The masking features are spaced from one another by gaps 36 (only some of which are labeled).

A patterned mask 40 is formed over the masking features 34. The patterned mask covers most of the masking features, but leaves masking features within the location 24 (wherein an interconnect will ultimately be formed) exposed within an opening 42 that extends through the patterned mask. The mask 40 may comprise any suitable composition, and in some embodiments may correspond to photolithographically-patterned photoresist.

Figure 5:
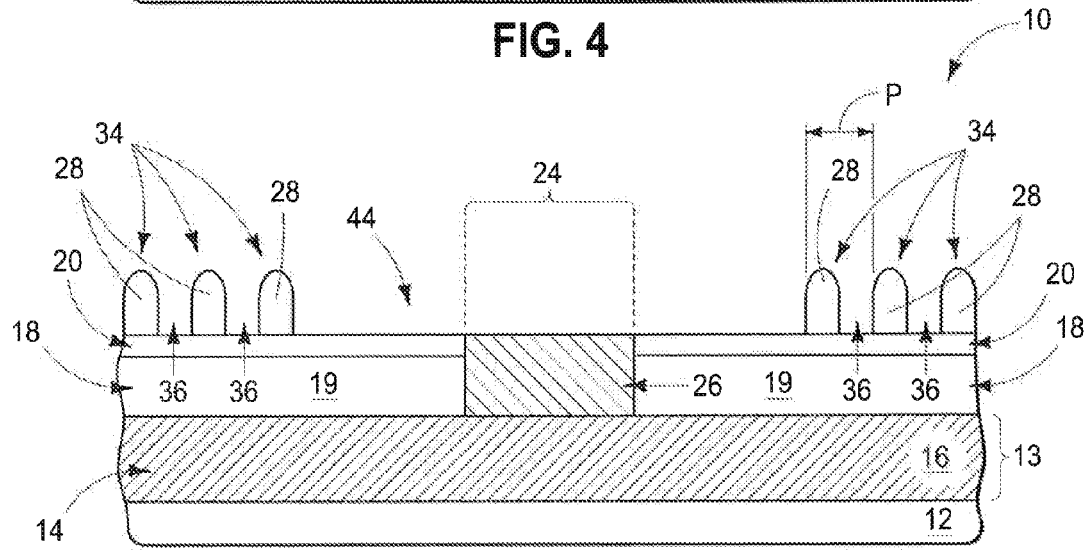

Referring to FIG. 5, the masking features 34 exposed within opening 42 (FIG. 4) are removed, and subsequently the patterned mask 40 (FIG. 4) is removed. The removal of the exposed masking features forms a gap 44 extending across conductive plug 26. In some embodiments, gaps 36 may be referred to as first gaps, and gap 44 may be referred to as a second gap.

Although the illustrated embodiment forms mask 40 (FIG. 4) after patterning the features 34 from material 28, in other embodiments the mask 40 may be provided over the template structures 32 (FIG. 3) and the opening 44 may be formed prior to transferring a pattern from the template structures into the underlying material 28. Thus, mask 40 may be applied before pattern transfer into material 28 in some embodiments, and after pattern transfer into material 28 in other embodiments.

Figure 6:
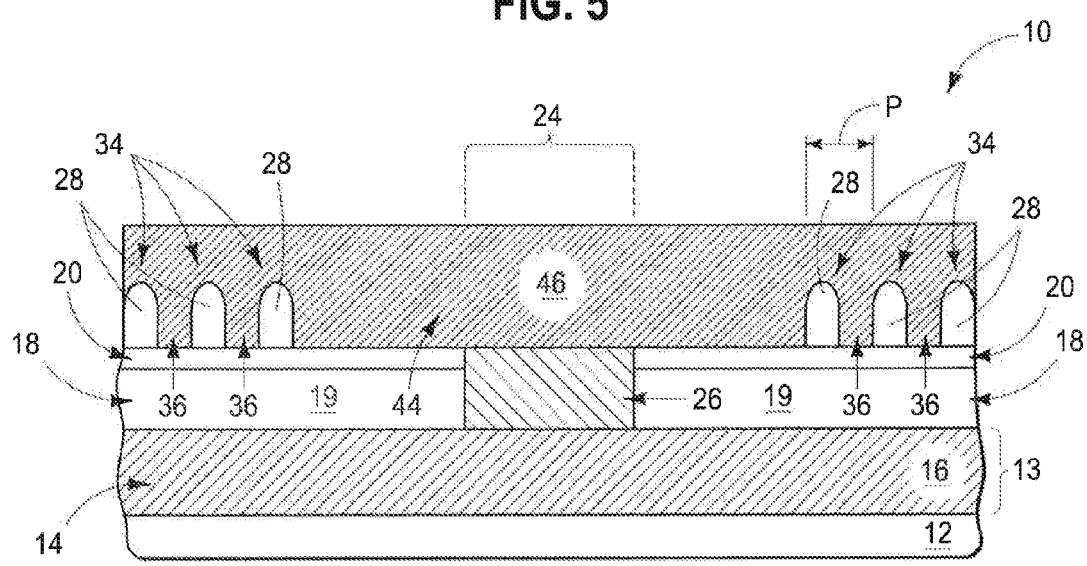

Referring to FIG. 6, electrically conductive material 46 is formed across masking features 34 and within the first and second gaps 36 and 44.

Figure 7:
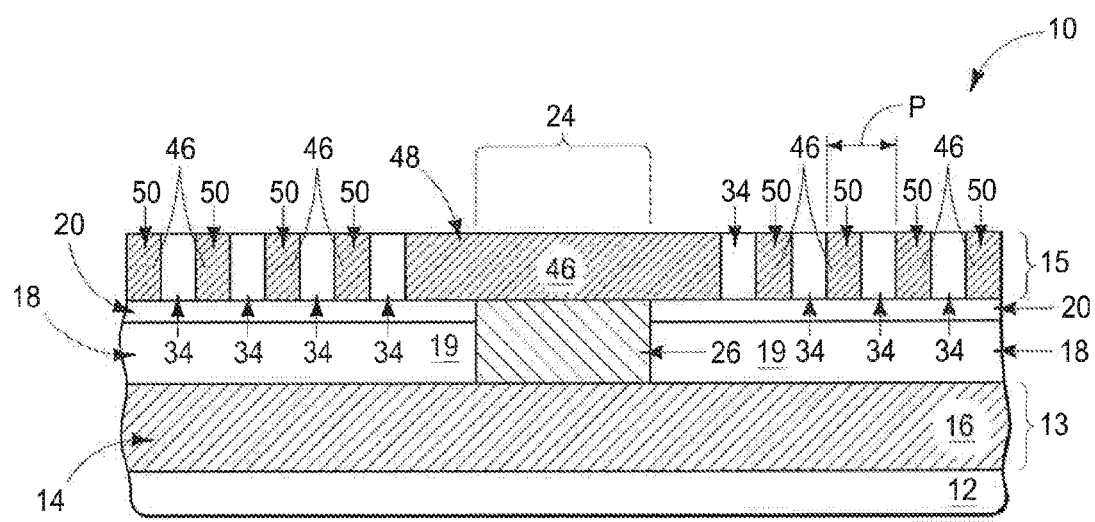

Referring to FIG. 7, construction 10 is subjected to planarization (for instance, CMP) to remove electrically conductive material 46 from over the masking features 34. Such patterns the conductive material 46 into a conductive structure 48 directly over and in contact with conductive plug 26, and into a plurality of repeating electrically conductive features 50. The electrically conductive features 50 form a second circuitry level 15. In the shown embodiment, the electrically conductive features 50 are formed to the high-density pitch P; and accordingly may be formed to a pitch of less than or equal to about 100 nm, less than or equal to about 50 nm, or even less than or equal to about 35 nm.

The electrically conductive features 50 may be any suitable features, and in some embodiments may be lines extending into and out of the page relative to the cross-sectional view of FIG. 7. Accordingly, the conductive features 50 may be lines which extend along a direction which is substantially orthogonal to the direction of the line 14 within the first level 13 of circuitry.

The conductive structure 48 and the plug 26 together form a portion of an interconnect extending to the upper surface of component 14. The structure 48 is a portion of the interconnect that extends through the densely-patterned circuitry of circuit level 15, and in the embodiment of FIGS. 1-7 such portion is formed simultaneously with formation of the electrical components 50 of such densely-patterned circuitry. Thus, such portion of the interconnect may comprise an identical composition as the electrical components 50 of the densely-patterned circuitry.

Figure 8:
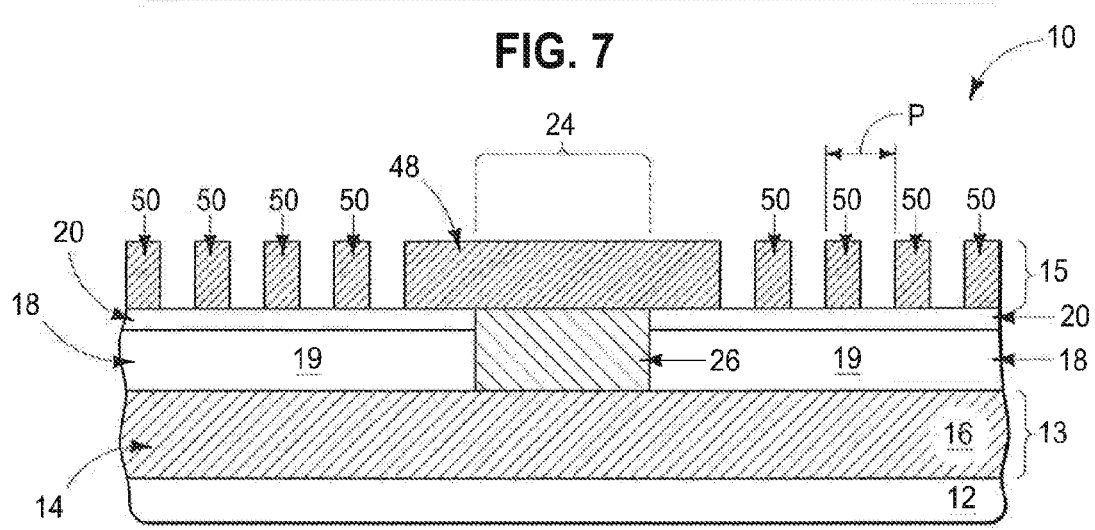

Referring to FIG. 8, masking features 34 (FIG. 7) are removed. Although the masking features are removed in the shown embodiment, if the masking features comprise suitable electrically insulative material they may be left in a finished construction in other embodiments to provide electrical isolation between adjacent components.

Figure 9:
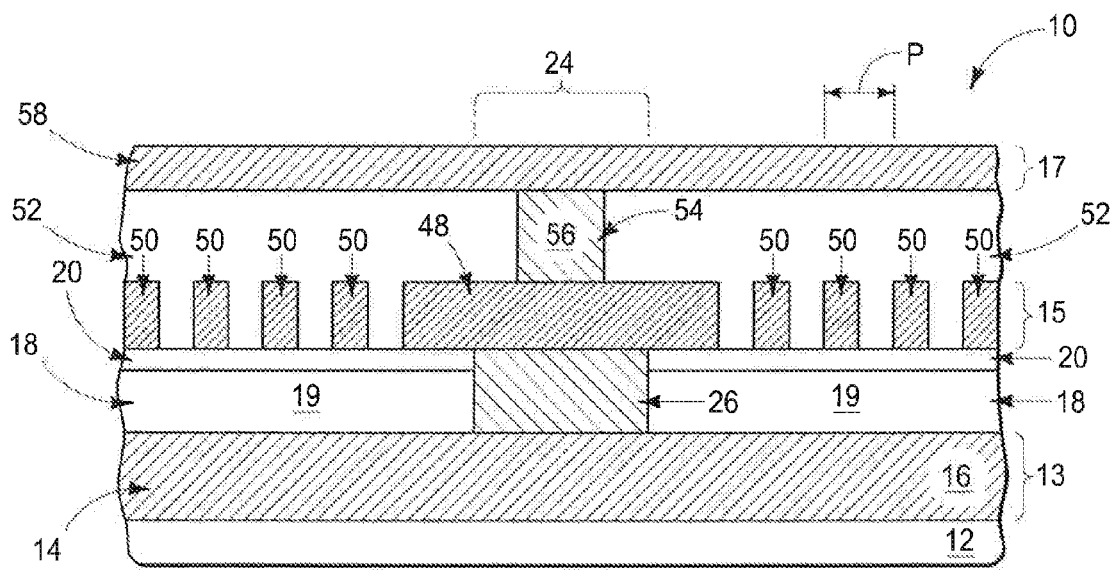

Referring to FIG. 9, a dielectric region 52 is formed over components 50 and conductive structure 48, and subsequently an opening 54 is etched through the dielectric region to an upper surface of the conductive structure 48. The opening 54 may be formed with any suitable processing, including, for example, utilization of a photolithographically-patterned photoresist mask (not shown) to define a location of the opening, an etch through material 52 to form the opening, and subsequent removal of the photoresist mask.

The opening 54 is filled with electrically conductive material 56. Such electrically conductive material may comprise any suitable composition or combination of compositions; including, for example, one or more of various metals, metal-containing compounds, and conductively-doped semiconductor materials. The conductive material 56 has a planarized upper surface in the shown embodiment, and such may be formed by, for example, CMP to remove material 56 from over the dielectric region 52.

A circuit component 58 is formed over and in direct contact with electrically conductive material 56. The circuit component 58 may be part of a third circuitry level 17 which is formed over the dielectric region 52. Thus, the conductive plug 26, conductive structure 48, and conductive material 56 together form an electrically conductive interconnect which connects a circuit component 14 within the first circuitry level 13 to a circuit component 58 within the third circuitry level 17. The interconnect extends through the densely-patterned circuitry of the second level 15, and extends within the location 24 defined by the patterned hard mask 20. The conductive portions of the interconnect corresponding to the conductive plug 26, conductive structure 48 and conductive material 56 may comprise the same composition as one another, or one or more of such conductive portions may comprise a different composition than one or more others of such conductive portions.

Although a single interconnect is shown formed through the densely-patterned circuit level 15, in other embodiments multiple interconnects may be formed to extend through the densely-patterned circuit level with analogous processing. Some of such interconnects may extend to levels other than the illustrated levels 13 and 17 directly adjacent level 15. Further, in some embodiments there may be multiple densely-patterned levels that are stacked one atop the other, and processing analogous to that of FIGS. 1-9 may be utilized to form interconnects that extend through more than one densely-patterned level.

Figure 10:
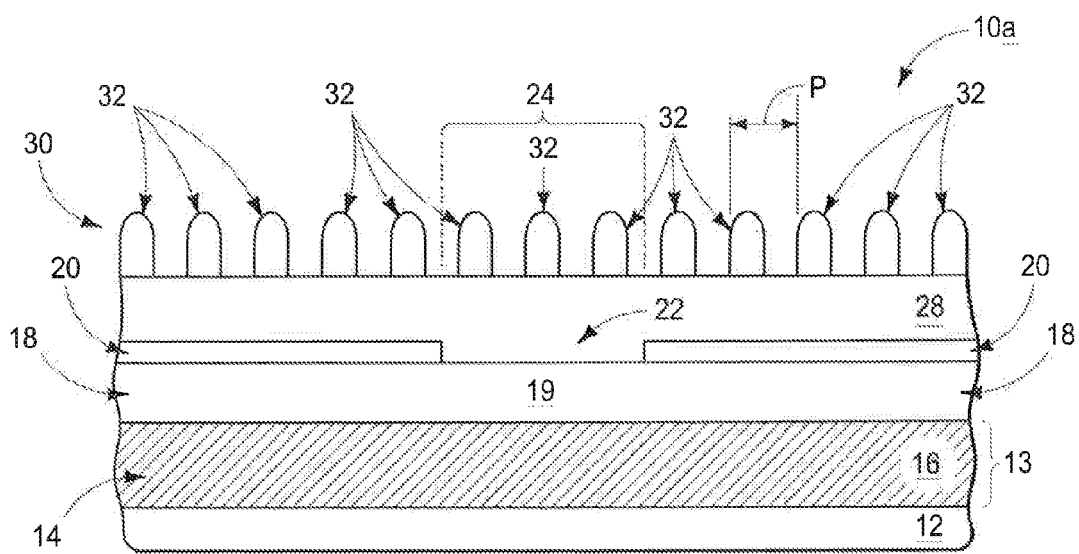
FIGS. 10-14 are diagrammatic cross-sectional views of a portion of a semiconductor construction at various stages of another example embodiment method.

Another example embodiment is described with reference to FIGS. 10-14. Referring to FIG. 10, a semiconductor construction 10a is shown at a processing stage subsequent to that of FIG. 1. The construction comprises the semiconductor base 12, circuitry level 13, dielectric region 18 and patterned hard mask 20 described above with reference to FIG. 1, with the dielectric region comprising the dielectric material 19. The patterned hard mask has the opening 22 extending therethrough which defines the location 24 where an interconnect will be formed.

The construction 10a is shown at a processing stage analogous to that of FIG. 3, and thus the construction comprises the mask material 28 and patterned mask 30 described above with reference to FIG. 3. However, the embodiment of FIG. 10 does not comprise a conductive plug analogous to the plug 26 shown in FIG. 3. The patterned mask 30 comprises the template structures 32 formed to the pitch P. In some embodiments, the patterned masks 20 and 30 may be referred to as first and second patterned masks, respectively, to distinguish them from one another.

As discussed above with reference to FIG. 3, mask material 28 may be considered to be a sacrificial material in some embodiments, in that the entirety of material 28 may be removed after utilizing material 28 to pattern circuit components. However, in other embodiments material 28 may have a suitable composition so that some of the material may remain in a finished construction to provide isolation between adjacent circuit components.

Figure 11:
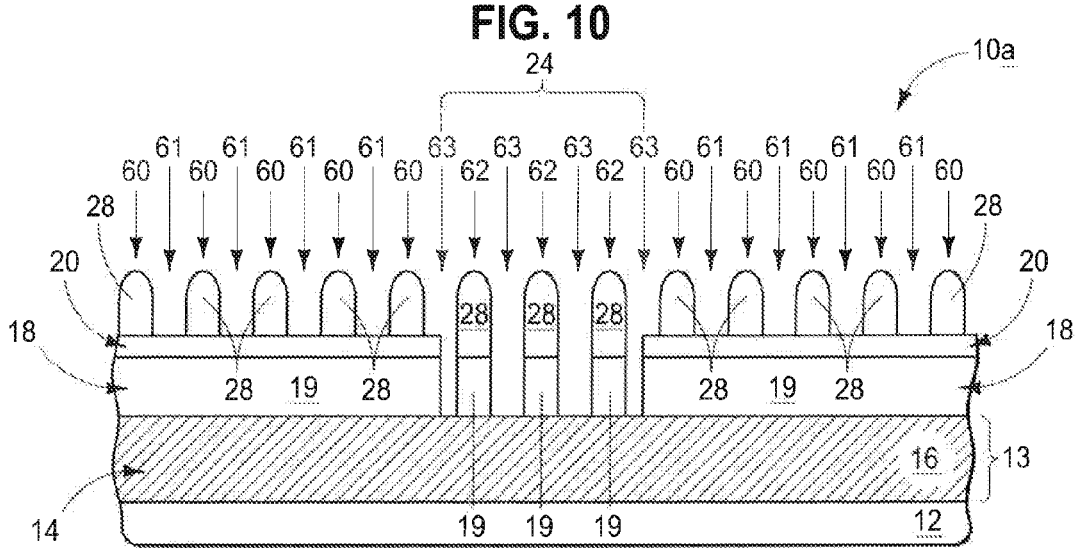

Referring to FIG. 11, a pattern of the template structures 32 (FIG. 3) is transferred into underlying materials 19 and 28 with an etch selective for materials 19 and 28 relative to materials of the hard mask 20 and conductive component 14, and then the template structures are removed. Such forms first gaps 61 extending to hard mask 20, and forms second gaps 63 extending to conductive component 14. Alternatively considered, material 28 is patterned into a plurality of masking features 60 directly over the patterned hard mask 20, and the materials 19 and 28 are together patterned into a plurality of masking features 62 directly over the component 14 within the location 24 where the interconnect will be formed. The masking features 60 are formed on the same pitch P that the template structures 32 (FIG. 10) were formed on.

Figure 12:
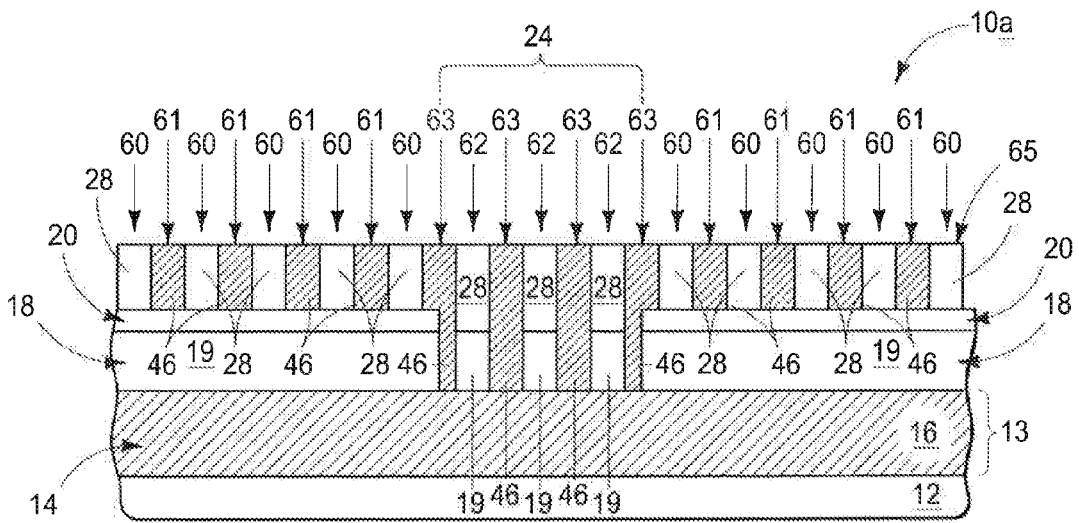

Referring to FIG. 12, electrically conductive material 46 is formed within the first and second gaps 61 and 63, and subjected to planarization to form a planarized surface 65 extending across the conductive material 46 and the mask material 28.

Figure 13:
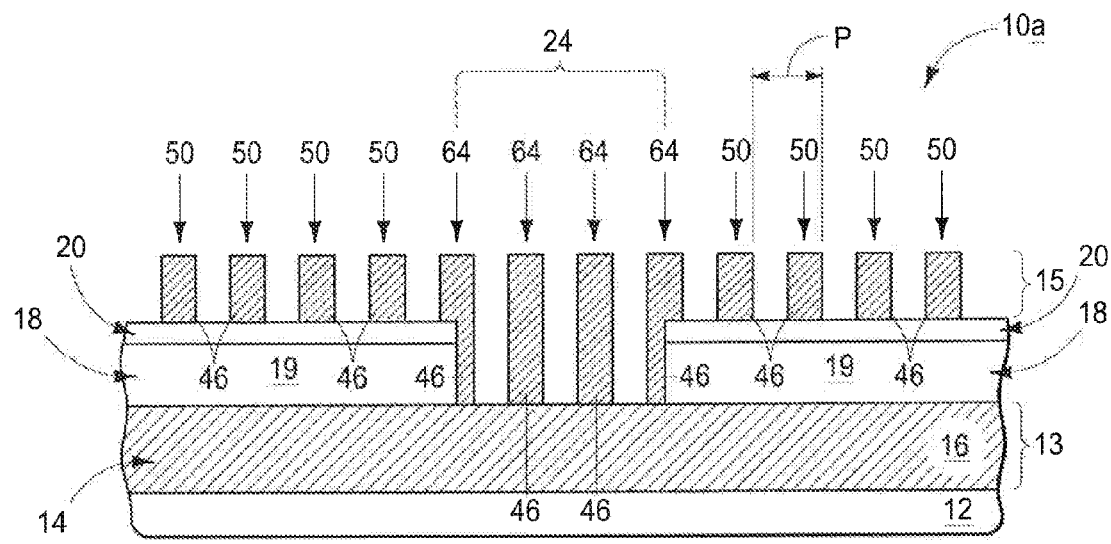

Referring to FIG. 13, masking features 60 and 62 (FIG. 12) are removed. Although the masking features 60 and 62 are removed in the shown embodiment, in other embodiments the masking features may comprise suitable compositions so that such masking features may remain as electrically insulative structures in a finished construction.

The remaining conductive material 46 is patterned into a plurality of electrically conductive posts 64 directly over and in contact with circuit component 14, and into the plurality of repeating electrically conductive features 50. The electrically conductive features 50 form the second circuitry level 15. In the shown embodiment, the electrically conductive features 50 are formed to the high-density pitch P; and accordingly may be formed to a pitch of less than or equal to about 100 nm, less than or equal to about 50 nm, or even less than or equal to about 35 nm. The electrically conductive posts 64 are separated from one another, and in the shown embodiment are also along the pitch P.

The electrically conductive features 50 may be any suitable features, and in some embodiments may be lines extending into and out of the page relative to the cross-sectional view of FIG. 13. Accordingly, the conductive features 50 may be lines which extend along a direction which is substantially orthogonal to the direction of the line 14 within the first level 13 of circuitry.

The conductive posts 64 form a portion of an interconnect extending to the upper surface of the circuit component 14. In the embodiment of FIGS. 10-13 such posts are formed simultaneously with formation of the electrical components 50 of the densely-patterned circuitry. Thus, the portion of the interconnect corresponding to posts 64 may comprise an identical composition as the electrical components 50 of the densely-patterned circuitry.

Figure 14:
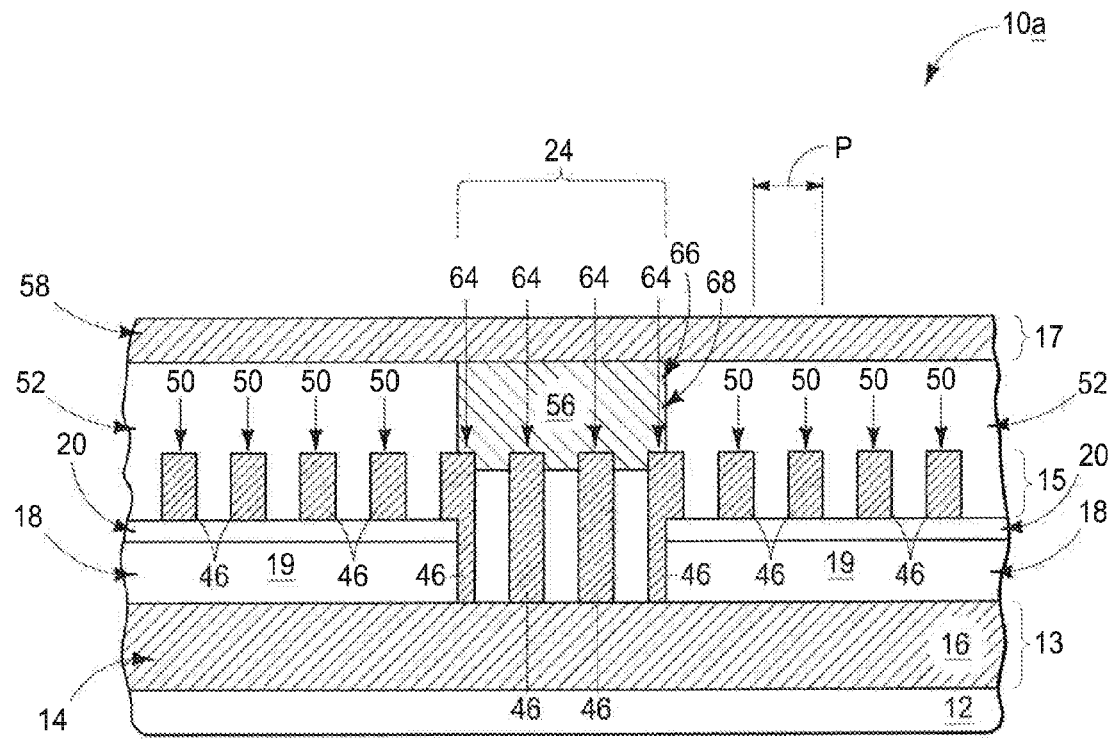

Referring to FIG. 14, the dielectric region 52 is formed over components 50 and posts 64, and subsequently an opening 66 is etched through the dielectric region to upper surfaces of the posts. The opening 66 may be formed with any suitable processing, including, for example, utilization of a photolithographically-patterned photoresist mask (not shown) to define a location of the opening, an etch through material 52 to form the opening, and subsequent removal of the photoresist mask. The opening 66 may extend to below upper surfaces of the posts, as shown.

The opening 66 is filled with the electrically conductive material 56. The electrically conductive material 56 has a planarized upper surface in the shown embodiment, and such may be formed by, for example, CMP to remove material 56 from over the dielectric region 52.

The circuit component 58 is formed over and in direct contact with electrically conductive material 56. The circuit component 58 is part of an illustrated third circuitry level 17 which is formed over the dielectric region 52. Thus, the posts 64 and conductive material 56 together form an electrically conductive interconnect which connects the circuit component 14 within the first circuitry level 13 to the circuit component 58 within the third circuitry level 17. The interconnect extends through the densely-patterned circuitry of the second level 15, and extends within the location 24 defined by the patterned hard mask 20. The conductive posts 64 may comprise the same composition as the conductive material 56, or may comprise a different composition relative to conductive material 56.

The construction 10a of FIG. 14 may be considered to comprise an intermediate circuitry level 15 between the levels 13 and 17, with such intermediate level having a high-density pattern of repeating electrically conductive features 50. The construction comprises a break in the pattern corresponding to an opening through the pattern, and comprises an interconnect extending through such opening to electrically connect the circuit component 14 within level 13 to the circuit component 58 within level 17. The interconnect comprises a plurality of electrically conductive posts 64 extending through the opening in the high-density pattern, and comprises the electrically conductive structure 68 intermediate the posts 64 and the component 58.

In some embodiments, the multi-post interconnect shown in FIG. 14 may be representative of a plurality of interconnects fabricated in a semiconductor construction to pass through one or more intermediate circuit levels of the construction.

Figure 15:
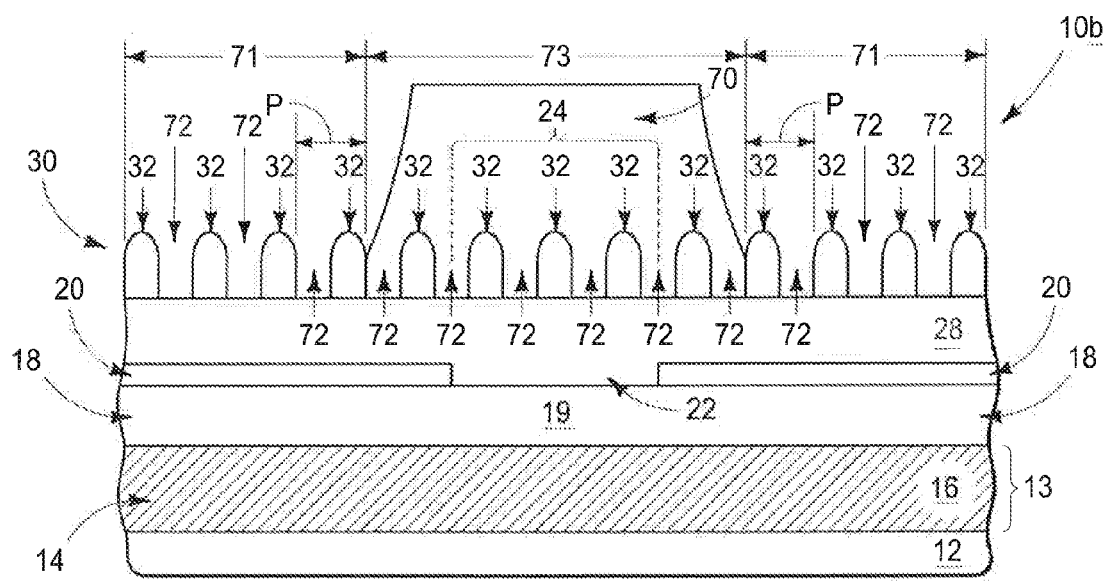
FIGS. 15-21 are diagrammatic cross-sectional views of a portion of a semiconductor construction at various stages of another example embodiment method.

Another example embodiment is described with reference to FIGS. 15-21. Referring to FIG. 15, a semiconductor construction 10b is shown at a processing stage subsequent to that of FIG. 10. The construction comprises the semiconductor base 12, circuitry level 13, dielectric region 18 and patterned hard mask 20, with the patterned mask having the opening 22 extending therethrough and defining the location 24 where an interconnect will be formed. The construction 10b also comprises the mask material 28, and the patterned mask 30, with the patterned mask 30 comprising the template structures 32 formed to the pitch P. The template structures are spaced from one another by gaps 72. The mask material 28 may be a dielectric material, such as silicon dioxide.

The construction 10b has another patterned mask 70 over the template structures 32. The patterned mask 70 may comprise any suitable composition or combination of compositions; and in some embodiments may comprise photolithographically-patterned photoresist. The mask 70 covers a first set of the template structures, while leaving a second set of the template structures uncovered. The mask material 28 may be considered to comprise a first portion 71 which is not covered by material of mask 70, and a second portion 73 which is covered by the material of mask 70.

In some embodiments, the masks 20, 30 and 70 may be referred to as first, second and third masks, respectively, to distinguish them from one another.

Figure 16:
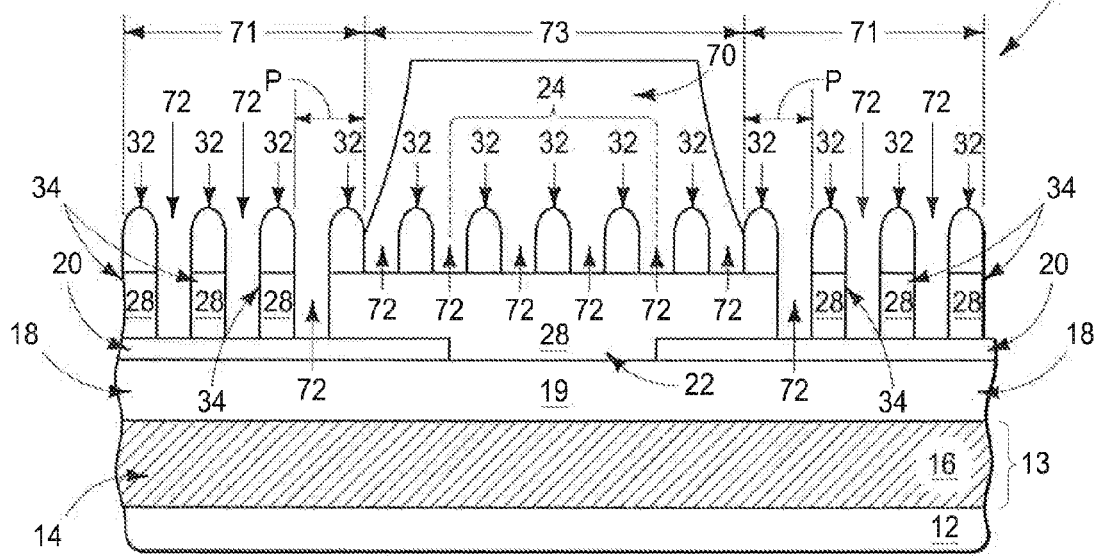

Referring to FIG. 16, the gaps 72 along the uncovered second set of template structures 32 are extended down to hard mask 20 to pattern the first portion 71 of mask material 28 into masking features 34 while material of mask 70 protects the second portion 73 of mask material 28 from being etched. The template structures 32 are shown remaining over the masking features 34 at the processing stage of FIG. 16. In other embodiments, the template structures 32 may be removed during or after formation of gaps 72 so that such template structures are not present at the processing stage of FIG. 16.

Figure 17:
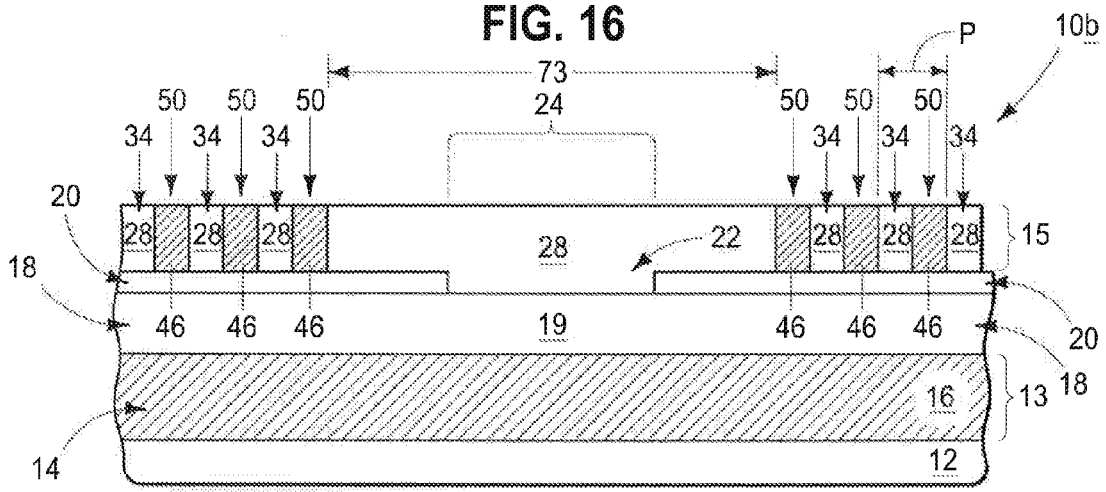

Referring to FIG. 17, electrically conductive material 46 is formed within gaps 72 (FIG. 16). Subsequently, planarization is utilized to form a planarized upper surface 75 extending across materials 28 and 46, and to thereby pattern material 46 into electrically conductive structures 50. The electrically conductive structures are formed to the high-density pitch, P; and form a second level 15 of circuitry over the dielectric region 18.

The template structures 32 (FIG. 16) and the mask 70 (FIG. 16) are removed in forming the shown processing stage of FIG. 17. The template structures 32 and mask 70 may be removed by the planarization utilized to form planarized upper surface 75, or may be removed prior to such planarization, and in some embodiments may be removed prior to forming the metal 46 within the gaps 72.

Figure 18:
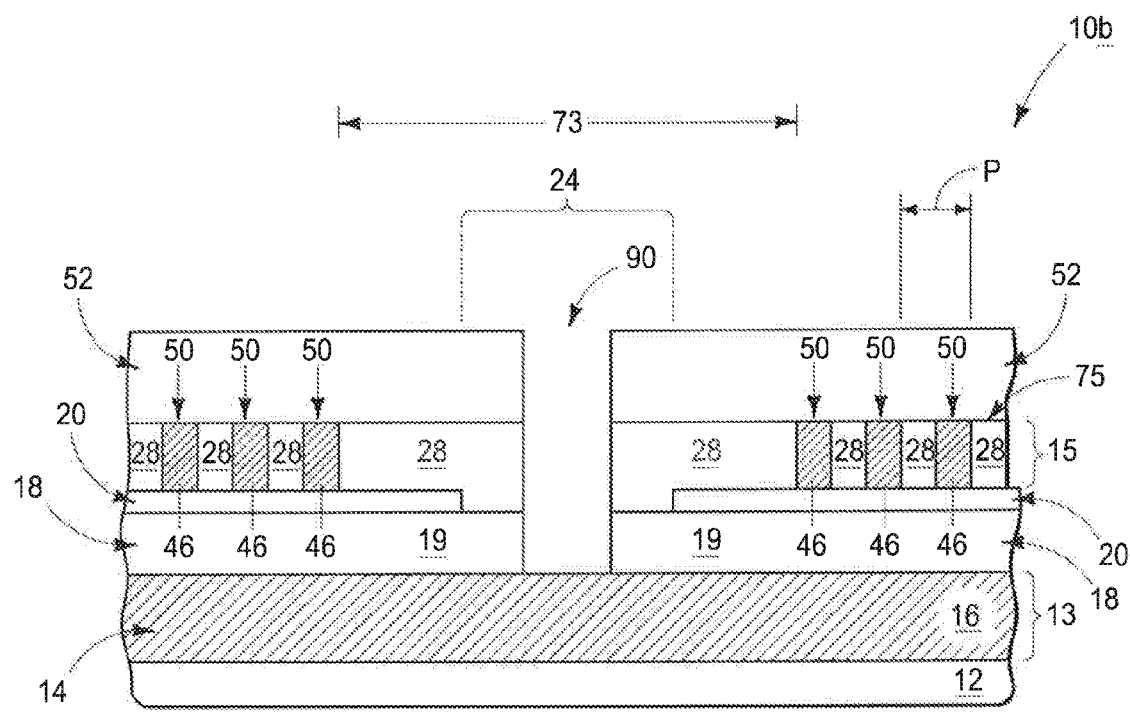

Referring to FIG. 18, the dielectric region 52 is formed over planarized upper surface 75. In the shown embodiment, the mask material 28 remains between electrical components 50 at the processing stage of FIG. 18. In other embodiments, the mask material may be a sacrificial material, and may be removed prior to formation of the dielectric region 52 so that the material of the dielectric region 52 replaces material 28 between the electrically conductive structures 50.

An opening 90 is patterned through the portion 73 of material 28 that had been covered by mask 70 (FIG. 15). Opening 90 may be formed with any suitable processing, including, for example, utilization of a photolithographically-patterned photoresist mask (not shown) to define a location of the opening, transferring a pattern from the photoresist mask into materials underlying the mask, and then removing the photoresist mask to leave the shown construction. The opening 90 extends to an upper surface of the circuit component 14.

Figure 19:
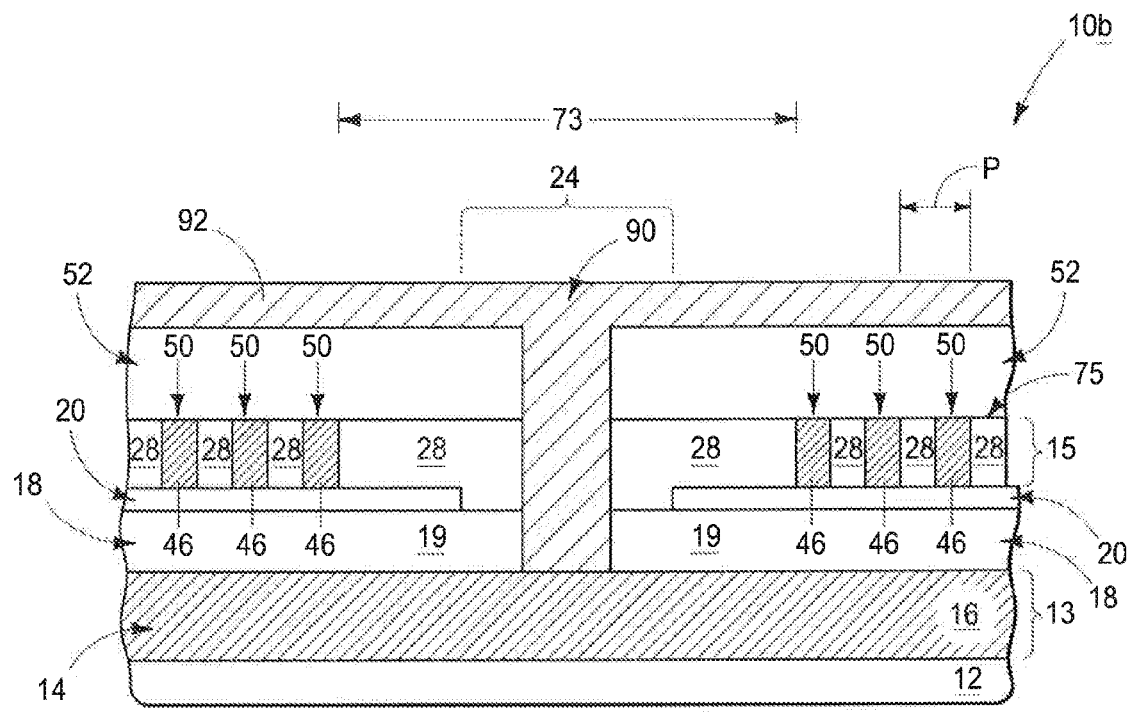

Referring to FIG. 19, electrically conductive material 92 is formed within opening 90 and across an upper surface of the dielectric region 52. The conductive material may comprise any suitable composition or combination of compositions; and in some embodiments may comprise, consist essentially of, or consist of one or more of various metals, metal-containing compounds, and conductively-doped semiconductor materials.

Figure 20:
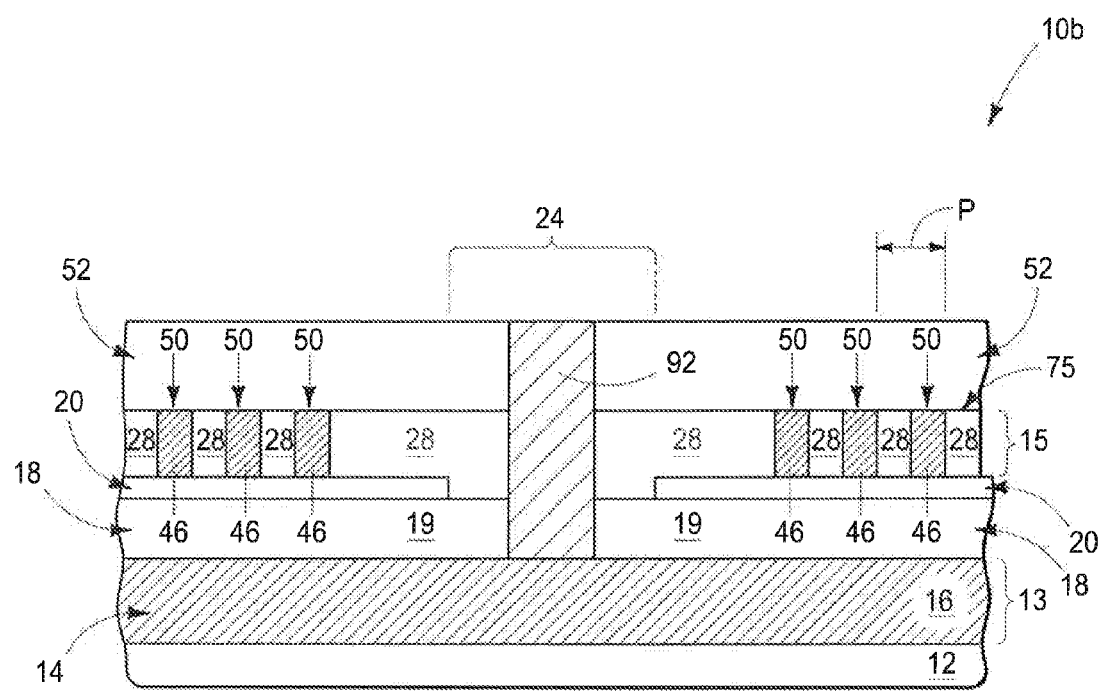

Referring to FIG. 20, construction 10b is subjected to planarization to remove material 90 from over the dielectric region 52.

Figure 21:
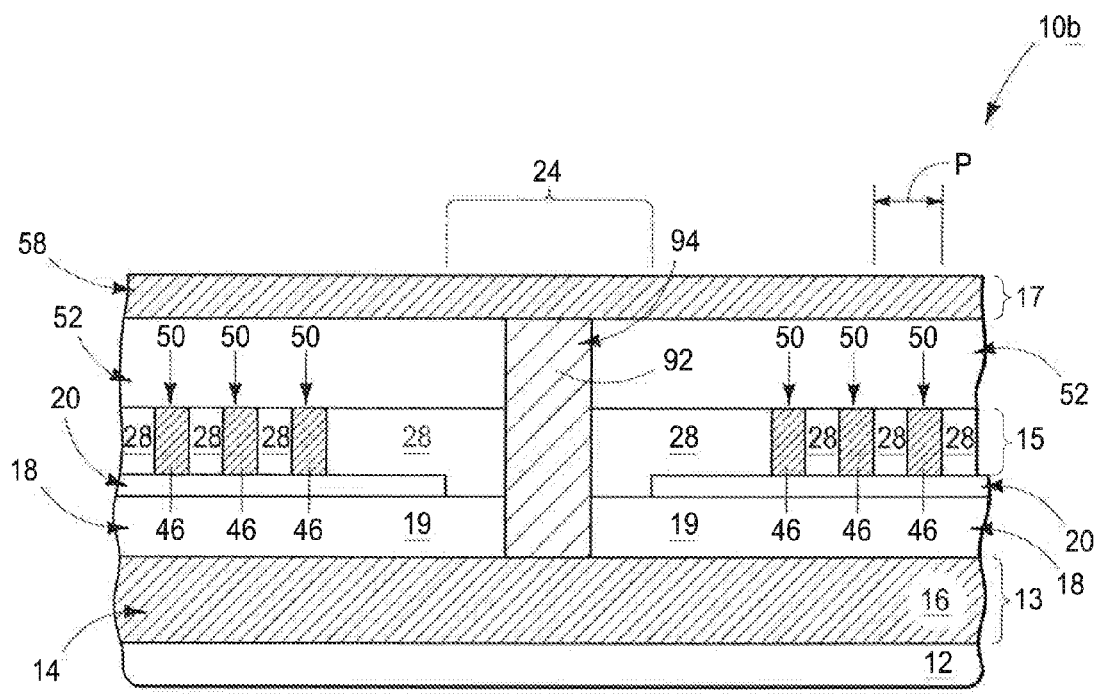

Referring to FIG. 21, the third level 17 of circuitry is formed over the dielectric region 52, with a circuit component 58 of the third level being in electrical contact with conductive material 92. Thus, material 92 forms an interconnect 94 that extends from circuitry of the upper level 17 to circuitry of the lower level 13. The interconnect 94 extends through the second level 15 of circuitry in the location 24 defined by patterned hard mask 20.

The embodiment of FIGS. 15-21 forms an entirety of the interconnect 94 after formation of the electrical components 50, rather than forming any of the interconnect during formation of such electrically conductive components, in contrast to the previous embodiments discussed herein. Thus, the embodiment of FIGS. 15-21 may enable the entirety of interconnect 94 to be formed of a different conductive material than is utilized for the circuit components 50.

Although the hard mask 20 is shown in the first embodiment of FIGS. 1-9, the second embodiment of FIGS. 10-14 and the third embodiment of FIGS. 15-21, the hard mask may be optional in some embodiments. For instance, the embodiments of FIGS. 1-9 and 15-21 may use a timed etch of material 28, or selectivity between materials 28 and 19, instead of using the hard mask to stop the etch of material 28 at a desired location. Further, if some over-etch occurs during the etching of material 28, such may not be problematic.

The interconnect-forming methodology described above may be utilized in any applications in which it is desired to form an interconnect extending through a densely-integrated level of circuitry, including, for example, NAND applications, DRAM applications, logic applications, etc.

The semiconductor constructions discussed above may be incorporated into electronic systems. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming an interconnect. A first dielectric region is formed over a first level of circuitry. A patterned hard mask is formed over the first dielectric region to define a location of an interconnect that extends through the first dielectric region to electrically connect with a circuit component of the first level of circuitry. A second level of circuitry is formed over the hard mask. The second level comprises repeating electrically conductive features. The interconnect is formed to extend through the second level of circuitry and within the defined location. A second dielectric region is formed over the second level of circuitry. A third level of circuitry is formed over the second dielectric region. The third level of circuitry is electrically connected to the first level of circuitry through the interconnect.

Some embodiments include a method of forming an interconnect. A first dielectric region is formed over a first level of circuitry. A second level of circuitry is formed over the first dielectric region. The second level comprises repeating electrically conductive features. An interconnect is formed to extend through the second level of circuitry and to electrically connect with the first level of circuitry. At least a portion of the interconnect is formed while forming the electrically conductive features. A second dielectric region is formed over the second level of circuitry. A third level of circuitry is formed over the second dielectric region. The third level of circuitry is electrically connected to the first level of circuitry through the interconnect.

Some embodiments include a method of forming an interconnect. A first dielectric region is formed over a first level of circuitry. A patterned mask is formed over the first dielectric region. The mask comprises masking features spaced from one another by gaps. Some of the gaps are first gaps corresponding to locations of electrically conductive features of a second level of circuitry, and at least one of the gaps is a second gap corresponding to a location of an interconnect that extends through the second level of circuitry. Electrically conductive material is formed within the first and second gaps and across the masking features. The electrically conductive material is planarized to remove the electrically conductive material from over the masking features while leaving the electrically conductive material within the first and second gaps. A second dielectric region is formed over the second level of circuitry. A third level of circuitry is formed over the second dielectric region. The third level of circuitry is electrically connected to the first level of circuitry through the interconnect.

Some embodiments include semiconductor constructions. A first level of circuitry is over a semiconductor base. A first dielectric region is over the first level of circuitry. A second level of circuitry is over the first level of circuitry. The second level comprises a pattern of repeating electrically conductive features and comprises an opening through the pattern. The high-density pattern is on a pitch of less than or equal to 100 nm. A second dielectric region is over the second level of circuitry. A third level of circuitry is over the second dielectric region. Multiple separate electrically conductive posts extend from the third level of circuitry to the first level of circuitry through the opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   a first level of circuitry;
   a first dielectric region over the first level of circuitry;
   a second level of circuitry over the first level of circuitry, the second level comprising a pattern of repeating electrically conductive features and comprising an opening through the pattern, the electrically conductive features being disposed laterally outward on both sides of the opening;
   a second dielectric region over the second level of circuitry;
   a third level of circuitry over the second dielectric region; and
   multiple separate electrically conductive posts extending from the third level of circuitry to the first level of circuitry through the opening.

2. The construction of claim 1 further comprising at least one level of circuitry between the first and third levels in addition to the second level of circuitry.

3. The construction of claim 1 wherein the first dielectric region comprises silicon dioxide; wherein silicon nitride is over the silicon dioxide; and wherein the electrically conductive features comprise electrically conductive lines directly against said silicon nitride.

4. The method of claim 1 wherein the repeating electrically conductive features are arranged to a pitch of less than or equal to about 100 nm.

5. The construction of claim 4 wherein the pitch is less than or equal to about 50 nm.

6. The construction of claim 1 wherein the repeating electrically conductive features and the electrically conductive posts are of a common composition as one another.

7. The construction of claim 1 wherein at least a portion of an interconnect that extends through the second level of circuitry and electrically connects with the first level of circuitry, the interconnect comprising the conductive posts, wherein the repeating electrically conductive features of the second level are laterally outward of the interconnect and not contacting the interconnect along a cross-section.

8. The construction of claim 7 wherein the third level of circuitry comprises a circuitry component connected to a circuitry component within the first level of circuitry through the interconnect.

9. The construction of claim 1 wherein the first level of circuitry comprises a line of the first circuitry level extending along a first direction; and wherein the electrically conductive features of the second circuitry level are lines extending along a second direction which is substantially orthogonal to the first direction.

10. The construction of claim 8 wherein the line of the first circuitry level comprises one or more members of the group consisting of copper, aluminum, nickel, titanium, tungsten, metal silicide, metal nitride, metal carbide and conductively doped semiconductive materials.

11. The construction of claim 1 wherein electrically insulative material utilized as masking features during formation of the construction are retained in a final structure.

12. A semiconductor construction, comprising:
    a first level of circuitry;
    a first dielectric region over the first level of circuitry;
    a second level of circuitry over the first level of circuitry, the second level comprising a pattern of repeating electrically conductive features and comprising an opening through the pattern, the electrically conductive features being disposed laterally outward on both sides of the opening;
    a second dielectric region over the second level of circuitry;
    a third level of circuitry over the second dielectric region; and
    a conductive plug forming part of an interconnect that extends from the third level of circuitry to the first level of circuitry, the repeating electrically conductive features of the second level being laterally outward of the interconnect and not contacting the interconnect along a cross-section.

13. The method of claim 12 wherein the repeating electrically conductive features are arranged to a pitch of less than or equal to about 100 nm.

14. The construction of claim 13 wherein the pitch is less than or equal to about 50 nm.

15. A semiconductor construction, comprising:
    a first level of circuitry;
    a first dielectric region over the first level of circuitry;
    a second level of circuitry over the first level of circuitry, the second level comprising a pattern of repeating electrically conductive features having a pitch of less than less than or equal to 100 nm and comprising an opening through the pattern, the electrically conductive features being disposed laterally outward on both sides of the opening, the repeating electrically conductive features consisting of non-dummy features;
    a second dielectric region over the second level of circuitry;
    a third level of circuitry over the second dielectric region; and
    one or more interconnects that extends from the third level of circuitry to the first level of circuitry.

16. The semiconductor construction of claim 15 wherein the one or more interconnects each comprise a conductive plug, a conductive structure over the conductive plug and a conductive material over the conductive structure.

17. The semiconductor construction of claim 16 wherein the conductive plug comprises one or more metals, one or more metal containing compounds, one or more conductively doped semiconductor materials, or combinations thereof.

18. The semiconductor construction of claim 16 wherein the conductive material comprises one or more metals, one or more metal containing compounds, one or more conductively doped semiconductor materials, or combinations thereof.

19. The semiconductor construction of claim 16 wherein the conductive structure comprises a material that is also comprised by the electrically conductive plug.

20. The semiconductor construction of claim 16 wherein the repeating electrically conductive features of the second level are laterally outward of the interconnect and do not contact the interconnect along a cross-section.

* * * * *

UNITED STATES PATENT AND TRADEMARK OFFICE
CERTIFICATE OF CORRECTION

Page 1 of 1

| | |
|---|---|
| PATENT NO. | : 9,123,722 B2 |
| APPLICATION NO. | : 14/177030 |
| DATED | : September 1, 2015 |
| INVENTOR(S) | : Ming-Chuan Yang et al. |

It is certified that error appears in the above-identified patent and that said Letters Patent is hereby corrected as shown below:

ON THE TITLE PAGE

(56) References Cited, U.S. Patent Documents – Insert:

| | | |
|---|---|---|
| --5,670,423 | 9/23/1997 | Yoo |
| 6,803,307 | 10/12/2004 | Chu |
| 7,307,015 | 12/11/2007 | Lee |
| 7,701,034 | 4/20/2010 | Chuang et al. |
| 7,897,297 | 3/1/2011 | Ke et al. |
| 2010/0003828 | 1/7/2010 | Ding et al.-- |

IN THE CLAIMS

Column 12, lines 28-29 – Replace "of less than less than or" with --of less than or--

Signed and Sealed this
Second Day of February, 2016

Michelle K. Lee
*Director of the United States Patent and Trademark Office*